United States Patent Office 3,707,373

Patented Dec. 26, 1972

3,707,373

LITHOGRAPHIC PLATE DEVELOPERS

Lawrence E. Martinson, Frederick J. Rauner, and Richard E. Gilson, Rochester, N.Y., assignors to Eastman Kodak Company, Rochester, N.Y.

No Drawing. Filed Mar. 17, 1969, Ser. No. 807,969
Int. Cl. G03c 5/00
U.S. Cl. 96—35.1 11 Claims

ABSTRACT OF THE DISCLOSURE

A composition for developing presensitized lithographic printing plates having pigmented photohardenable polymer coatings is described which comprises a solvent for the polymer composition which does not appreciably swell the photohardened polymer and an acid which prevents formation of stain and scum on the hydrophilic areas of the plate.

This invention relates to lithography. In a particular aspect it relates to developer compositions for presensitized lithographic printing plates.

Light-sensitive polymers and polymer compositions have gained widespread use in the preparation of photomechanical images such as lithographic printing plates. On exposure to actinic radiation these polymers crosslink, or harden, and become relatively insoluble in solvents for the unexposed polymer, thus creating a differentiation between exposed and unexposed areas. This property is utilized in preparing printing plates by coating a lithographic support with a layer of the light-sensitive polymer, together with addenda such as sensitizers, colorants, etc., and exposing this plate to an imagewise pattern of radiation, thereby creating soluble and insoluble areas on the coating in accordance with its exposure to radiation. An image is developed on the plate by removing the unexposed, unhardened, soluble polymer therefrom, such as by treatment of the plate with a developer solvent or solution for the unexposed polymer.

It is advantageous to produce an image which is visible at the time of development. This has been accomplished in many cases by using a developer solution which contains a dye or pigment. The proper choice of developer solution is more difficult when the light-sensitive coating contains a pigment. Unless there is a very careful balance of properties in the developer solution, pigment which is used for coloring the polymer layer is leached from the image areas. This creates a problem with the cleanliness of the background areas (stain) and also gives a false indication of the speed index of the plate. The speed of the plate is judged on the basis of the firt solid step of a graduated step tablet which is visible after processing. If this step does not correspond to the first step which carries ink when the plate is used to make lithographic prints, the value of the exposure indication is diminished considerably. Therefore, it would be desirable to have a developer solution for lithographic plates which make use of pigmented polymer compositions, which will cleanly develop the plate to remove unwanted portions of the polymer, but which will not cause a leaching out of the pigment.

A further problem with the clean development of lithographic plates of the above type is that plates which have been kept for considerable time before use are less easily developed than freshly prepared plates; that is, an unusual amount of staining or scumming takes place on older plates. It is desirable, therefore, that the developer solution produce plates without stain and scum with pigmented coatings not only on fresh plates, but also on aged plates.

It is an object of this invention to provide a novel developer composition for lithographic printing plates containing a pigmented coating of light-sensitive polymers, which will cleanly remove the unexposed portion of the pigmented light-sensitive coating without removing any appreciable amount of pigment from the exposed areas.

It is another object of this invention to provide a novel developer composition which will readily develop coatings of light-sensitive polymers which are freshly prepared as well as aged coatings.

In accordance with the present invention there is provided a novel developer composition for pigmented coatings of light-sensitive polymers which comprises a solvent for the unexposed polymer composition which does not substantially swell the exposed, hardened polymer composition, and an acid, which prevents formation of stain and scum in non-image areas. The developer composition can also include components which improve its working characteristics, such as wetting agents and the like which assure even spreading and good contact between the developer composition and the printing plate, and agents which maintain the pH of the developer composition in the desired range, as well as components which improve the working characteristics of the developed printing plate, such as resins and greasy substances which improve the inking characteristics of the oleophilic image areas of the plate.

These developer compositions remove the unexposed light-sensitive polymer composition from the unexposed areas of the printing plate, but do not leach pigment out of the exposed, hardened area. Further, they prevent deposition of pigment in background areas thus eliminating stain in these areas. The use of an acid in the developer composition enhances the developing action with plates which have been stored for a substantial period of time, up to one year or more, before use, and prevents formation of stain and scum in the background area of the plate. Unlike developer compositions based on other solvents, such as chlorinated hydrocarbons, the developer compositions of the present invention give a true indication of the speed index of the plate; the first solid step which is visible on the developed plate corresponds to the first step which prints.

The solvents which have been found to be particularly useful in preparing developer compositions according to the present invention include cyclic esters, such as lactones, for example, butyrolactone, propiolactone, valerolactone, hexanolactone, and the like, as well as lower alkyl esters of organic carboxylic acids, such as butyl lactate, propyl lactate, amyl lactate, and the like. These solvents have been found to have good solvent action on the unexposed polymer composition but do not swell the exposed polymer sufficiently to permit leaching of the pigment from the exposed, insolubilized areas of the printing plate. Generally, these solvents have boiling points above about 150° C., and other relatively high boiling solvents which do not swell the exposed polymer composition could be substituted for them with similar results.

The acids which have been found useful in preventing scumming and staining in background areas of the plate are mineral acids, such as phosphoric acid, hydrochloric acid, etc., and organic carboxylic acids such as monocarboxylic acids, for example, acetic acid, hydroxycarboxylic acids, for example, lactic acid and glycolic acid, unsaturated carboxylic acids, for example, α-pentenoic acid, and the like. Typically the amount of acid added to the developer composition is about from 1 to 5 percent by volume, based on the amount of solvent employed. Since an acidic developer is preferred, the amount of acid added should be such that, in combination with the other components present, the developer composition is acidic, preferably at a pH of between about 2 and 6.

In addition to the above components, the developer composition preferably contains one or more wetting agents or other components which impart good spreading characteristics to the developer composition and helps suspend polymer and pigment removed from the background areas of the plate, and one or more oleophilicity improving agents which adhere to the exposed, hardened image areas of the plate and improve their inking characteristics. Suitable wetting agents include polyhydric alcohols such as glycerol, pentaerylthritol, diethylene glycol, triethylene glycol, oligomeric poly(ethylene gycols), etc.; esters of inorganic acids such as phosphate esters of such alkanols as n-hexanol, n-octanol, n-decanol, etc., phosphate esters of such alkoxyalkanols as 2-n-octyloxyethanol, 2-n-decyloxyethanol, etc., mixtures of such phosphate esters, etc.; esters of organic acids such as the dioctyl esters of sodium sulfosuccinic acid; polyethers such as octyl phenoxy polyethoxyethanol, ethylene oxide polymers, nonyl phenyl polyethylene glycol ether etc.; and the like; as well as commercially available materials sold under such trademarks as "Zonyl A," "Triton X–35," "Triton X–45," "Surfynol 450," "Aerosol OT." "Tergitol 15," etc. The amount of these materials added to the developer composition will of course depend upon the particular agent employed and its characteristics. Typically they can be employed in amounts of about from 1 to 10 percent by volume based on the amount of solvent.

Suitable oleophilicity improving agents include resinous materials such as hydrogenated rosin esters, colophony, etc., and organic esters such as methyl abietate, etc. As with the wetting agent, the amount of the oleophilicity improving agent added to the developer composition will depend upon the particular agent employed. From about 1 to 15 percent by volume, based on the amount of solvent present, will usually give satisfactory results.

In addition to the above components it is often desirable to add a minor amount of a basic amine, such as triethanolamine, to the developer composition to aid in eliminating background stain and scumming. About 5 to 15 percent by volume, based on the amount of solvent employed, is typical of the amount of amine which can be added to the developer composition.

The developer compositions of the present invention are particularly useful in developing lithographic printing plates having coatings of such light-sensitive polymers as polyesters, polycarbonates and polysulfonates which contain the light-sensitive grouping $$\text{—CH=CH—}\overset{\text{O}}{\overset{\|}{\text{C}}}\text{—}$$

as an integral part of the polymer backbone. Polymers containing this light-sensitive grouping are described in U.S. Pat. 3,030,208, U.S. application Ser. No. 828,455, filed July 21, 1959, now U.S. Pat. 3,453,237, issued July 1, 1969, and U.S. application Ser. No. 709,496, filed Feb. 29, 1968, now U.S. Pat. 3,622,320, issued Nov. 23, 1971. The polyesters can be prepared by condensing a suitable polycarboxylic acid, or the lower alkyl ester or chloride of a suitable polycarboxylic acid with a suitable polyhydric alcohol, in the presence of an esterification catalyst. The polycarbonates can be prepared by reaction of one or more polyhydric alcohols with phosgene, or by reaction of a bischloroformate of a polyhydric alcohol with another polyhydric alcohol. The light-sensitive grouping can be contained either in the polycarboxylic acid or in the polyhydric alcohol. Typical polycarboxylic acids include p-phenylene diacrylic acid, fumaric acid, succinic aid, adipic acid, terephthalic acid, etc., and mixtures of these acids. Typical polyhydric alcohols include ethylene glycol, 1,3-propane diol, 1,6-hexane diol, neopentyl glycol, 1,4-cyclohexanedimethanol, 1,4-di-β-hydroxyethoxycyclohexane, diphenylol propane, tetrachlorodiphenylolpropane, dihydroxy chalcones and dihydroxy dibenzal ketones such as divanillal cyclopentanone, 4,4′-dihydroxychalcone, etc., as well as mixtures of these diols.

The lithographic printing plate carries a layer of the light-sensitive polymer coated on a support, such as a plate of such metals as aluminum, anodized aluminum, copper, zinc, etc., paper, polymeric coated paper, synthetic resins, and the like. The support is often subbed with a coating which improves adhesion of the light-sensitive polymer and increases the hydrophilic properties of the background areas of the printing plate.

In practice the exposed lithographic printing plate is developed with the developer compositions of this invention by applying the developer composition to the surface of the plate for a period of time sufficient to remove the polymer from unexposed areas of the plate. Gentle mechanical action aids in removing the polymer composition from unexposed areas of the plate. Thus, swabbing is a highly useful method of applying the developer composition to the plate. The developer composition has sufficient activity that it can be employed at room temperature, or it can be employed at elevated temperatures up to about 90° F. After the initial application of the developer composition a second application can be applied, followed by either a single or double application of a desensitizing composition. The plate is then dried.

The following examples further illustrate this invention.

EXAMPLE 1

An anodized aluminum plate is whirl coated with a light-sensitive polymer composition having the following formulation:

| | | |
|---|---|---|
| Light-sensitive polyester prepared by condensing 100 mole percent p-phenylenediethoxyacrylate with 100 mole percent 1,4-di-β-hydroxyethoxycyclohexane | g | 4.0 |
| (2 - benzoylmethylene)-1-methyl-β-naphthothiazoline | g | 0.32 |
| Benzoic acid | g | 0.16 |
| Hydroquinone | g | 0.08 |
| Monochlorobenzene | ml | 100.0 |
| Pigment (Heliogen Blue K, C.I. Pigment Blue 15) | g | 0.8 |

The plate is dried, exposed to insolubilizing radiation through a negative and developed by swabbing with the following developer composition:

| | | |
|---|---|---|
| 4-butyrolactone | ml | 500.0 |
| Triethanolamine | ml | 50.0 |
| Glycerol | ml | 50.0 |
| Methyl abietate | ml | 5.0 |
| Hydrogenated wood rosin (Staybelite resin, Hercules Powder Co.) | g | 0.5 |
| Wetting agent (Zonyl A, DuPont) | ml | 4.5 |

The plate is cleanly developed by swabbing action without an appreciable leaching out of the pigment from the printing areas. The plate is treated with a desensitizing formulation containing gum arabic. When the plate is run on a press, there is a direct correspondence between the speed step of the print and the speed step of the processed pigmented coating.

EXAMPLE 2

A developer composition similar to that of Example 1 is prepared except that butyl lactate is substitued for 4-butyrolactone. Nearly identical results are obtained when this composition is used to develop a plate as described in Example 1. Similar results are obtained when propiolactone, valerolactone, or hexanolactone are used in place of 4-butyrolactone. When solvents such as benzyl alcohol, N-methyl pyrrolidone, cyclohexanone methyl Cellosolve acetate, trichloroethylene, monochlorobenzene, benzyl acetate, ethyl acetoacetate are used in place of the 4-butyrolactone, an undesirable degree of leaching out of the pigment takes place. This results in plates which have low visual contrast and reduced over-all density of the pigmented image. Further, there is wide discrepancy in the speed of the plate as indicated by the first solid step on the processed plate and the actual printed image.

EXAMPLE 3

The developer compositions described in Examples 1 and 2 work adequately on freshly prepared plates. In accelerated aging tests, where plates are kept for one week at 120° F. and 50 percent relative humidity before exposure and development, problems with stain and scum occur. The example describes a developer composition which eliminates these problems. An anodized aluminum plate is coated and aged for one week at 120° F. and 50 percent relative humidity for one week. The plate is then exposed to insolubilizing radiation and developed with the following composition:

| | | |
|---|---|---|
| 4-butyrolactone | ml | 1000.0 |
| Glycerol | ml | 100.0 |
| Methyl abietate | ml | 10.0 |
| Hydrogenated wood rosin (Staybelite resin, Hercules Powder Co.) | g | 1.0 |
| Wetting agent (Zonyl A, DuPont) | ml | 10.2 |
| Distilled water | ml | 100.0 |
| Phosphoric acid (85 percent) | ml | 25.0 |

The plate is cleanly developed without appreciable leaching out of pigment from insolubilized areas, and without formation of stain and scum in background areas. The developed plate is then desensitized with gum arabic. When the plate is run on a press, there is a direct correspondence between the speed of the print and the speed of the first solid step in the processed coating.

EXAMPLE 4

Similar results are obtained when Example 3 is repeated using the following developer composition:

| | | |
|---|---|---|
| 4-butyrolactone | ml | 1000.0 |
| Triethanolamine | ml | 100.0 |
| Glycerol | ml | 100.0 |
| Methyl abietate | ml | 10.0 |
| Hydrogenated wood rosin (Staybelite resin, Hercules Powder Co.) | g | 1.0 |
| Wetting agent (Zonyl A, DuPont) | ml | 9.0 |
| Lactic acid (70 percent) | ml | 31.0 |

The invention has been described in detail with particular reference to preferred embodiments thereof, but it will be understood that variations and modifications can be effected within the spirit and scope of the invention.

What is claimed is:

1. A process for developing an imagewise exposed lithographic printing plate having a pigmented coating of a light-sensitive polymer containing the $$-CH{=}CH-\overset{\overset{\displaystyle O}{\|}}{C}-$$

group as an integral part of the polymer backbone, the process comprising (1) applying to the surface of the printing plate an acidic developer composition comprising a solvent selected from the group consisting of lactones and lactates which will remove polymer coating from unexposed areas of the printing plate without substantially swelling the polymer coating in exposed areas of the printing plate and an acid selected from the group consisting of mineral acids and organic carboxylic acids which prevents formation of stain and scum in hydrophilic areas of the printing plate, and (2) removing polymer coating from unexposed areas of the printing plate without leaching a substantial amount of pigment out of exposed areas of the printing plate.

2. A process as defined in claim 1 wherein said acid comprises 1 to 5 percent by volume, based on the volume of the solvent.

3. A process as defined in claim 1 in which said developer further comprises a wetting agent.

4. A process as defined in claim 3 wherein said wetting agent is selected from the group consisting of polyhydric alcohols, polyethers, and esters of inorganic acids.

5. A process as defined in claim 4 wherein said wetting agent comprises 1 to 10 percent by volume, based on the volume of the solvent.

6. A process as defined in claim 1 in which said developer further comprises a hydrogenated rosin ester.

7. A process as defined in claim 1 in which said developer further comprises methyl abietate.

8. A process as defined in claim 1 in which said developer further comprises triethanolamine.

9. A process for developing an imagewise exposed lithographic printing plate having a pigmented coating of a light-sensitive polymer containing the $$-CH{=}CH-\overset{\overset{\displaystyle O}{\|}}{C}-$$

group as in integral part of the polymer backbone, the process comprising (1) applying to the surface of the printing plate an acidic developer composition comprising a lactone solvent which will remove polymer coating from unexposed areas of the printing plate without substantially swelling the polymer coating in exposed areas of the printing plate and an acid selected from the group consisting of phosphoric acid, hydrochloric acid, lactic acid, glycolic acid, acetic acid and α-pentanoic acid, which prevents formation of stain and scum in hydrophilic areas of the printing plate, and (2) removing polymer coating from unexposed areas of the printing plate without leaching a substantial amount of pigment out of exposed areas of the printing plate.

10. A process as defined in claim 9 wherein the lactone solvent is selected from the group consisting of butyrolactone, propiolactone, valerolactone and hexanolactone and the acid is present in an amount of from 1 to 5 percent by volume, based on the volume of the solvent, and is selected from the group consisting of phosphoric acid and acetic acid.

11. A process as defined in claim 9 wherein the developer composition further comprises from 1 to 10 percent by volume, based on the volume of the solvent, of a wetting agent selected from the group consisting of polyhydric alcohols, polyethers and esters of inorganic acids and from 1 to 15 percent by volume, based on the volume of the solvent, of a hydrogenated resin ester and methyl abietate.

References Cited

UNITED STATES PATENTS

| | | | |
|---|---|---|---|
| 3,085,874 | 4/1963 | Kelley | 75—84.4 |
| 3,373,115 | 3/1968 | Steppan | 96—33 |
| 3,357,831 | 12/1967 | Wu | 96—35.1 |
| 3,166,421 | 1/1965 | Gramlich | 96—33 |

DAVID KLEIN, Primary Examiner

E. C. KIMLIN, Assistant Examiner

U.S. Cl. X.R.

96—33